United States Patent
Chiang et al.

(10) Patent No.: US 11,245,258 B2
(45) Date of Patent: Feb. 8, 2022

(54) OPTIMAL SPARSE PLACEMENT OF PHASOR MEASUREMENT UNITS AND STATE ESTIMATION OF KEY BUSES IN DISTRIBUTION NETWORKS

(71) Applicant: Bigwood Technology, Inc., Ithaca, NY (US)

(72) Inventors: Hsiao-Dong Chiang, Ithaca, NY (US); Qiancheng Lv, Tianjin (CN); Xiangyu Kong, Tianjin (CN)

(73) Assignees: Bigwood Technology, Inc., Ithaca, NY (US); Tianjin University, Tianjin (CN)

( * ) Notice: Subject to any disclaimer, the term of this patent is extended or adjusted under 35 U.S.C. 154(b) by 30 days.

(21) Appl. No.: 17/007,301

(22) Filed: Aug. 31, 2020

(65) Prior Publication Data
US 2021/0083474 A1 Mar. 18, 2021

Related U.S. Application Data (60) Provisional application No. 62/870,613, filed on Jul. 3, 2019.

(51) Int. Cl.
*H02J 3/00* (2006.01)
(52) U.S. Cl.
CPC .............. *H02J 3/003* (2020.01); *H02J 3/004* (2020.01); *H02J 2203/20* (2020.01)
(58) Field of Classification Search
CPC ........ H02J 3/003; H02J 3/004; H02J 2203/20; H02J 3/242; H02J 13/00002; H02J 2203/10; G01R 19/2513; G06Q 10/04; Y02E 40/30; Y02E 40/70; Y02E 60/00; Y04S 10/22; Y04S 10/30; Y04S 40/20
See application file for complete search history.

(56) References Cited

U.S. PATENT DOCUMENTS

| | | | |
|---|---|---|---|
| 2013/0036311 A1* | 2/2013 | Akyol | H04L 9/3247 713/189 |
| 2016/0187399 A1* | 6/2016 | Simonov | G01R 22/00 702/62 |
| 2016/0313197 A1* | 10/2016 | Acharya | H02P 9/105 |
| 2017/0214244 A1* | 7/2017 | Dall'Anese | H02J 13/00016 |
| 2017/0336465 A1* | 11/2017 | Pignati | G01R 31/086 |
| 2018/0217568 A1* | 8/2018 | Parvania | G06Q 10/06312 |

\* cited by examiner

*Primary Examiner* — Ziaul Karim
(74) *Attorney, Agent, or Firm* — Tong J. Lee (57) ABSTRACT

A method for state estimation of a distribution network comprises: (a) obtaining measurements from phasor measurement units (PMUs) placed at buses in the distribution network; (b) constructing a quotient gradient system (QGS) based on a constraint set H that relates the measurements to state variables of the distribution network; (c) integrating the QGS to reach a steady state; (d) identifying one or more of the state variables whose measurement residuals violate a measurement residual constraint in the constraint set H; (e) integrating a reconstructed QGS, which is reconstructed based on the constraint set H by setting the identified one or more state variables to values of corresponding PMU measurements; (f) iterating steps of (d) and (e) until no measurement residuals violate the measurement residual constraint, to thereby obtain the state estimation; and (g) reporting the state estimation to a control system during real-time monitoring of the distribution network.

20 Claims, 7 Drawing Sheets

OPTIMAL SPARSE PLACEMENT OF PHASOR MEASUREMENT UNITS AND STATE ESTIMATION OF KEY BUSES IN DISTRIBUTION NETWORKS

CROSS-REFERENCE TO RELATED APPLICATIONS

This application claims the benefit of U.S. Provisional Application No. 62/870,613 filed on Jul. 3, 2019, the entirety of which is incorporated by reference herein.

TECHNICAL FIELD

Embodiments of the invention relate to power system management; more specifically, to the state estimation of a distribution network.

BACKGROUND

Power system state estimation (PSSE) constitutes the backbone of the Energy Management System (EMS) for power systems. PSSE plays a significant role in the real-time monitoring and control of power systems for reliable and economic operations.

Power system states can be measured in real-time by phasor measurement units (PMUs). Thousands of PMUs have been deployed throughout in the North America transmission networks to monitor grid stability on high voltage transmission systems. Compared to a transmission network, a distribution network in a power grid generally has vastly more measurement points and a physical structure that requires a high measurement accuracy. Thus, some distribution networks have deployed a large number of low-cost PMUs, such as micro-PMUs, to perform high-accuracy phasor measurements for real-time monitoring.

State estimation using a conventional weighted least square (WLS) estimator typically requires a large number of real-time measurements gathered by a large number PMUs. It is, however, infeasible to place PMUs at every node of a distribution network due to technical and economic constraints. Thus, the number of available real-time measurements in an existing distribution network is usually very small. There is a need for optimal placement of a limited number of PMUs in a distribution network, and to perform real-time state estimation based on the limited number of PMU measurements.

SUMMARY

In one embodiment, a method is provided for state estimation of a distribution network. The method comprises the steps of: (a) obtaining measurements from a plurality of phasor measurement units (PMUs) placed at a plurality of buses in the distribution network; (b) constructing a quotient gradient system (QGS) based on a constraint set H that relates the measurements to state variables of the distribution network; (c) integrating the QGS to reach a steady state; (d) identifying one or more of the state variables whose measurement residuals violate a measurement residual constraint in the constraint set H; (e) integrating a reconstructed QGS, which is reconstructed based on the constraint set H by setting the identified one or more state variables to values of corresponding PMU measurements; (f) iterating steps of (d) and (e) until no measurement residuals violate the measurement residual constraint, to thereby obtain a solution for the state variables as the state estimation; and (g) reporting the state estimation to a control system during real-time monitoring of the distribution network.

In another embodiment, a non-transitory computer-readable storage medium including instructions that, when executed by a computer system, cause the computer system to perform state estimation of a distribution network. The computer system is operative to: (a) obtain measurements from a plurality of phasor measurement units (PMUs) placed at a plurality of buses in the distribution network; (b) construct a quotient gradient system (QGS) based on a constraint set H that relates the measurements to state variables of the distribution network; (c) integrate the QGS to reach a steady state; (d) identify one or more of the state variables whose measurement residuals violate a measurement residual constraint in the constraint set H; (e) integrate a reconstructed QGS, which is reconstructed based on the constraint set H by setting the identified one or more state variables to values of corresponding PMU measurements; (f) iterate steps of (d) and (e) until no measurement residuals violate the measurement residual constraint, to thereby obtain a solution for the state variables as the state estimation; and (g) report the state estimation to a control system during real-time monitoring of the distribution network.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide (i) an optimal placement method for the placement of PMUs in distribution networks to meet different requirements using different numbers of PMUs; and (ii) a dynamic estimation method based on a nonlinear dynamical system approach for performing state estimation (or partial state estimation) of distribution networks using a limited number of measurement devices such as PMUs or micro-PMUs.

The term "partial state estimation" herein refers to the estimation of a portion of state variables at predetermined key buses based on real-time measurements. "State estimation" includes partial state estimation. An example of partial state estimation includes the estimation of voltage amplitudes and phase angles. Partial state estimation is useful for controlling specific aspects of a power system; for example, voltage control is mainly based on estimated voltage amplitudes and thermal limit control is mainly based on estimated phase angles. The disclosed methods, by solving a nonlinear dynamical system problem, produce partial state estimation with improved accuracy over conventional methods. The disclosed methods can produce an accurate result based on measurements collected by a limited number of PMUs sparsely placed in a distribution network.

Figure 1:
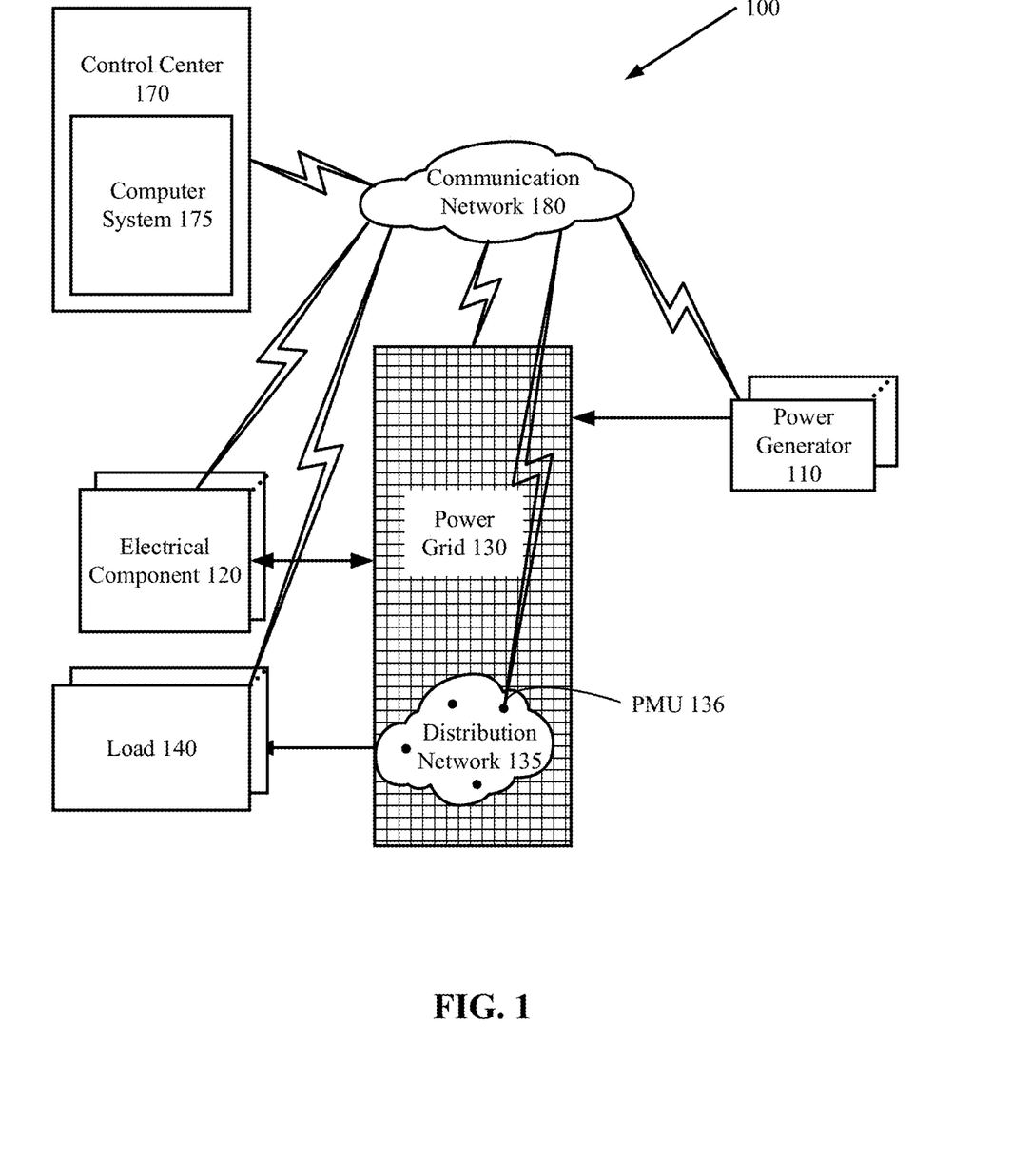
FIG. 1 illustrates a power system in which embodiments of the invention may operate.

FIG. 1 illustrates an example of a power system 100 in which embodiments of the invention may operate. The power system 100 includes multiple power generators 110 and electrical components 120 (such as shunt capacitors, transformers, converters, etc.), all of which are coupled to a power grid 130 that includes power transmission lines (also referred to as a transmission network) and power distribution lines (also referred to as a distribution network 135). The power generators 110 may be located in power plants and/or distributed across a geographic area. In some embodiments, the power system 100 may also include renewable power generators (e.g., solar power generators, wind power generators, etc.) and multiple power storage devices (e.g., batteries) coupled to the power grid 130. It is understood that the power system 100 may include more or fewer types of components than what is disclosed herein.

The power grid 130 includes a transmission network to transmit high-voltage electric power from the power generators to substations. The substations include transformers to transform electricity from high voltage to low voltage for distribution. The distribution network 135 distributes low-voltage electric power to electrical load 140, such as customers. The distribution network 135 includes buses, capacitors, and other electrical components.

The distribution network 135 also includes PMUs 136 to perform real-time monitoring of the distribution network 135. The PMUs 136 are placed at selected buses in the distribution network 135 to measure voltage amplitudes and phase angles of the electricity in the distribution network 135. In some embodiments, the PMUs 136 may include micro-PMUs. In the disclosure herein, the terms "PMUs" and "micro-PMUs" may be used interchangeably, as the disclosed methods are applicable to both PMUs and micro-PMUs.

The power system 100 also includes a control center 170 where operators of the power system 100 control the power system operations. An operator in the control center 170 may monitor the system status, and run computer programs on a computer system 175 to estimate the states of the system including the key buses. The computer system 175 may report the state estimation to the operator in the control center 170 during real-time monitoring of the distribution network. The estimated states of the key buses may be used to compute branch power flow (e.g., line power flow), identify nodes that have abnormal voltage (e.g., low voltage or high voltage), and compute distribution losses, etc. Base on the computed and/or identified outcome, the operator may take actions to control the system including but not limited to: corrective control actions to fix issues such as abnormal voltage, abnormal line power flow, and to minimize distribution losses.

In one embodiment, the computer system 175 is in communication with the devices or components (including the micro-PMUs 136) of the power system 100 via a communication network 180. The communication network 180 may be a propriety wide-area network or a public network such as the Internet protected with data encryption capabilities. In one embodiment, the generators 110, the electrical components 120, the power grid 130, the distribution network 135, and the loads 140 are modeled as buses and lines in a power system analysis.

The following description includes two parts. The first part of the description presents a method for placing PMUs in a distribution network (e.g., the distribution network 135) to meet the requirements of predetermined key buses whose states are to be accurately estimated. The key buses may be determined based on a system analysis or by users. The second part of the description presents partial state estimation of a distribution network, where the distribution network contains predetermined key buses whose states are to be accurately estimated using a limited number of PMU measurements. As previously mentioned, the terms "PMU" and "micro-PMU" are herein used interchangeably.

Since the distribution network described herein contains multiple zero-injection nodes, an effective use of zero-injection measurements can increase the number of observable nodes. In the following, a suitable model for inclusion of zero-injection nodes considering a three-phase network topology is described.

Definition 1: When zero-injection buses are connected together, these zero-injection buses are defined as a zero-injection bus group (ZIBG).

Figure 2A:
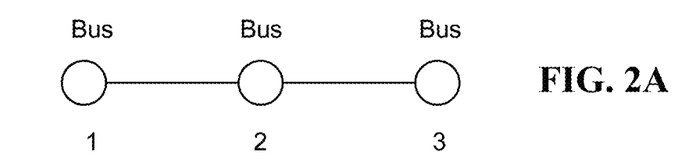
FIG. 2A, FIG. 2B, and FIG. 2C illustrate bus groups according to some embodiments.

FIG. 2A illustrates an example where bus 1, bus 2, and bus 3 are zero-injection buses. The three buses form 6 ZIBGs: $\{1\}, \{2\}, \{3\}, \{1,2\}, \{2,3\}$, and $\{1,2,3\}$.

Definition 2: The term "observable bus" means that the voltage phasor (i.e., voltage amplitude and phase angle) of the bus can be estimated using a set of available measurements with a numerical method.

The following six observability schemes will be used to derive an observability vector for a given topology in a distribution network.

Scheme 1: A bus is observable when the bus is configured with a micro-PMU. Further, a bus is observable when its connected bus is configured with a micro-PMU and the phases of the bus are no more than that of the micro-PMU-installed bus.

Scheme 2: If buses connected to a ZIBG are all observable, the ZIBG is observable.

Figure 2B:
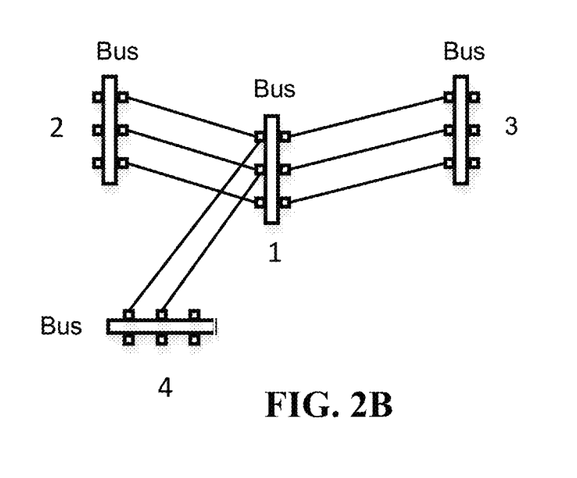
Figure 2C:
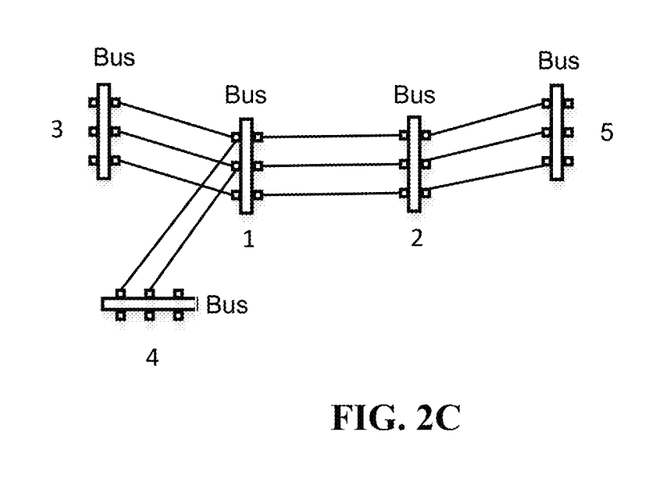

In FIG. 2B, bus 1 is a zero-injection bus, and bus 1 is observable if buses 2, 3, and 4 are all observable. In FIG. 2C, bus 1 and bus 2 are zero-injection buses. Bus 1 and bus 2 are observable if buses 3, 4, and bus 5 are all observable. When considering bus 1 and bus 2 as ZIBGs, whether or not bus 3, bus 4, and bus 5 are zero-injection buses does not affect the result.

Scheme 3: If an observable zero-injection bus and some connected unobservable zero-injection buses constitute a ZIBG, then all of the buses involved are observable.

The following schemes 4 and 5 are two special cases of scheme 3.

Scheme 4: The nodes at both ends of the switch have the same observability.

Scheme 5: If one branch has power flow measurements (P and Q) and one end A of the branch is observable, the opposite side B of the branch is observable when the phases of bus B are no more than that of bus A.

Scheme 6: If one bus has power injection measurements (P and Q), the bus can be treated as a zero-injection bus.

Given a network topology, for any micro-PMU placement, an observability vector of the corresponding distribution network can be derived using the observability schemes described above. The observability vector is used to describe which buses in the distribution network are observable. For example, $G_k$ is an n×1 observability vector under a k-th topology, of which $g_{ki}=1$ if bus i is observable under the k-th topology and 0 otherwise.

Method for solving an optimal PMU placement problem. Consider the following nonlinear integer programming problem with inequality constraints:

$$\min_{s.t.\ x \in X_Z} f(x) \quad (1)$$

where $X_Z \subset R_Z^n$ is a subset, and $R_Z^n$ is a collection of all the integer points on $R^n$.

We define:

$$X_Z = \{x \in R_Z^n | 1 \leq x_i \leq m\} \quad (2)$$

where m is the range of each dimension. The nonlinear integer optimization problem formulated in (1) and (2) can be solved by a nonlinear integer programming method; e.g., the following 3-stage group-based optimization method.

Stage 1: Discrete particle swarm optimization. Assume that the number of micro-PMUs installed is given. A discrete particle swarm optimization (DPSO) method can be used to solve the optimal micro-PMU placement problem. In DPSO, a particle represents the buses to place micro-PMUs. The fitness function is the objective of (1). Velocity and position are the basic properties of every particle, which are updated according to the following schemes.

$$v_i^{k+1} = wv_i^k + c_1 * rand_1() * (pbest_i - x_i^k) + c_2 * rand_2() * (gbest_i - x_i^k) \quad (3)$$

where $v_i^k$ is the ith velocity component at iteration k; $rand_1()$ and $rand_2()$ are random numbers between 0 and 1; $x_i^k$ is the current position in the ith dimension; $c_1$, $c_2$ are the acceleration coefficients; $pbest_i$ is the personal best position in the ith dimension; $gbest_i$ is the global best position in the ith dimension; and w is the inertia weight factor. It is noted that Stage 1 of the group-based optimization method can be implemented not only by the DPSO, but also by other meta-heuristic methods, such as the genetic algorithm, simulated annealing, etc.

Stage 2: Grouping particles by clustering schemes. Cluster all of the particles into multiple groups of particles using a clustering scheme such as the k-means scheme based on the distance between vectors. The cluster center uses the m elements with the highest frequency in the group. It is worth noting that the order in which the elements appear does not matter. For example, for a set of vectors {[1,2,3,4,5], [1,2,4,5,6], [1,3,4,5,6], [3,4,5,6,7]}, the elements and corresponding frequencies are [1,2,3,4,5,6,7] and [3,2,3,4,4,3,1], respectively. So the cluster center is [1,3,4,5,6]. For every group, the method selects three best particles and the cluster center to form a new group to represent the group.

Stage 3: Local optimization method. Apply a local optimization method (which can compute local optimal solutions) to each particle selected in Stage 2 to compute the corresponding local optimal solution. These local optimal solutions provide the locations and the number of micro-PMUs to be placed in the distribution network.

A method for placing micro-PMUs. The following description provides an optimal placement scheme of micro-PMUs, which meets the requirements of different situations using different numbers of micro-PMUs placed in a distribution network. We consider a general m-bus distribution network with a set of pre-specified key buses whose state vectors are to be estimated (i.e., observable). Three different situations are presented below.

In the first situation, the OPP aims to meet the following requirement: the state of all of the key buses are to be estimated by the placement of micro-PMUs.

According to the requirement of the first situation, the optimal micro-PMU placement (OPP) is to find the minimum number of micro-PMUs and the corresponding locations for the micro-PMUs to be installed in order to observe (i.e., estimate the states of) all of the key buses; e.g., the voltage of these key buses can be estimated based on the placement of micro-PMUs. The following OPP problem formulation (i.e., problem (4)) is proposed and the solution for (4) satisfies the requirement for the first situation.

$$\min f = \sum_{k=1}^{N} x_i \quad (4)$$

s.t. $G_k \geq C$ $G_k = g_k(X) = (g_{k1}, \ldots, g_{kN})^T$ $C = (c_1, \ldots, c_N)^T$ $X = [x_1, \ldots, x_N]^T$ $x_i \in \{0,1\}$ $k = 1, \ldots, m$ $i = 1, \ldots, N$ The problem (4) is further explained below.

(i) The objective function $f$ minimizes the number of micro-PMUs under the condition that the key buses are all observable (i.e., the constraint $G_k \geq C$ is satisfied).

(ii) $G_k$ is the n×1 observability vector under the k-th topology, of which $g_{ki}=1$ if bus i is observable under the k-th topology and 0 otherwise. The details and schemes of obtaining the observability vector have been derived above.

(iii) $c_i=1$ if bus i is a key bus and 0 otherwise.

(iv) $x_i$ is the micro-PMU placement variable, i.e., $x_i=1$ when a micro-PMU is placed at bus i and 0 otherwise.

(v) N is the number of buses and m is the number of possible topologies.

Figure 3:
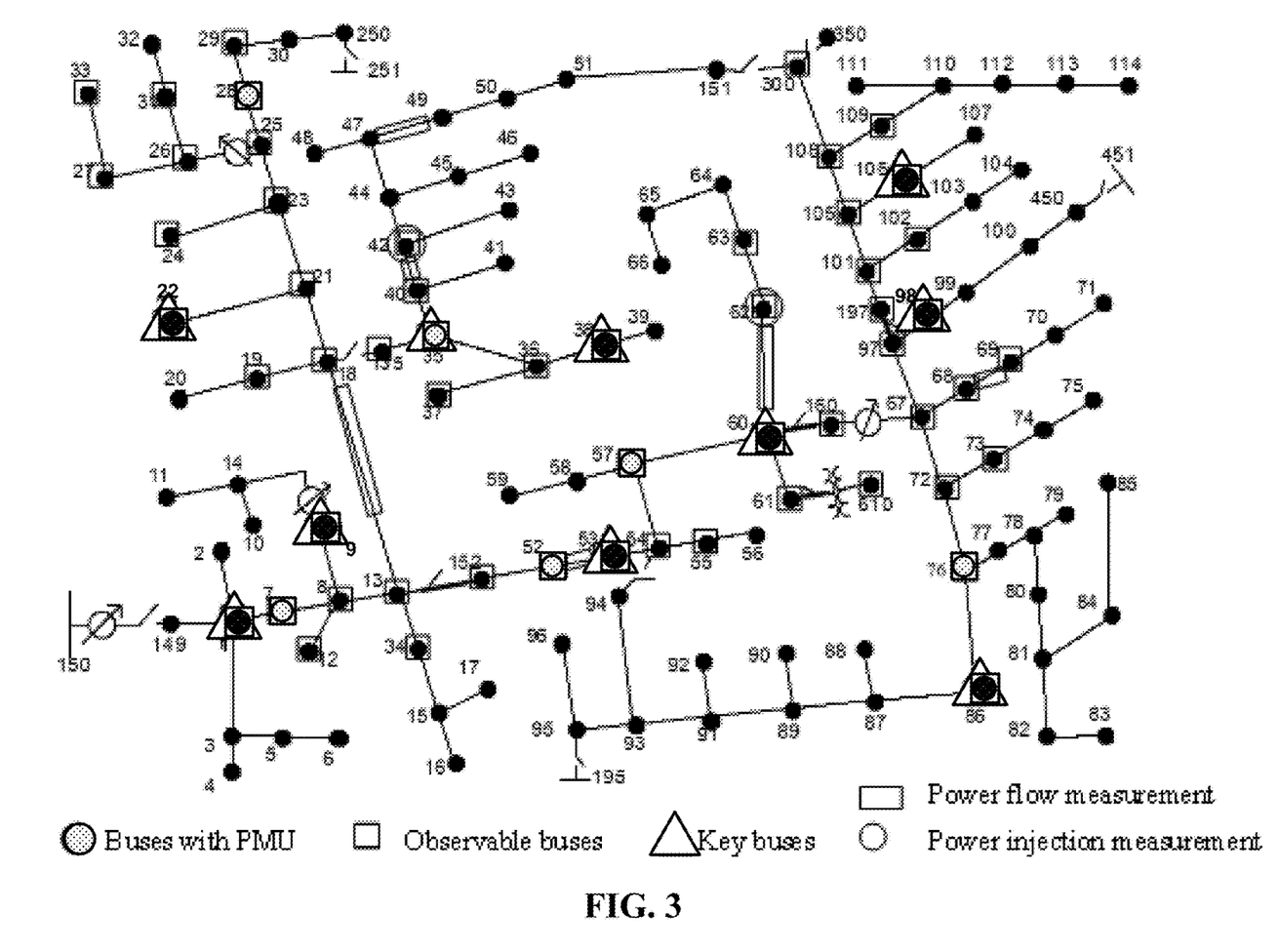
FIG. 3 illustrates an example of PMUs placement in a first situation according to one embodiment.

Take the IEEE 123-node test feeder as an example. Suppose that 10 buses (1, 9, 22, 35, 38, 53, 60, 86, 98, 106) are selected as key buses and that one of the possible topologies is shown in FIG. 3. Apply the proposed 3-stage group-based optimization method to solve the problem (4).

The obtained optimization result shows that a minimum number of 7 micro-PMUs are needed and placed at buses 7, 28, 35, 52, 57, 76, 97 to observe all of the key buses. The locations of the micro-PMUs are shown in FIG. 3.

In the second situation, the OPP aims to meet the following two requirements: (1) key buses are observable (i.e., the key buses can be estimated so that real-time monitoring of these key buses is possible) by the placement of micro-PMUs, and (2) the number of observable non-key buses is as many as possible.

The following OPP problem formulation (i.e., problem (5)) is proposed and the solution for (5) satisfies the requirements for the second situation.

$$\max f = \left(\sum_{i=1}^{N} u_i\right) * V \qquad (5)$$

$$\text{s.t. } u_i = \prod_{k=1}^{m} g_{ki}$$

$$V = \prod_{k=1}^{m} J(G_k, C)$$

$$G_k = g_k(X) = (g_{k1}, \dots, g_{kN})^T$$

$$C = (c_1, \dots, c_N)^T$$

$$X = [x_1, \dots, x_N]^T$$

$$x_i \in \{0, 1\}$$

$$\sum_{i=1}^{N} x_i = l$$

$$k = 1, \dots, m$$

$$i = 1, \dots, N$$

The problem (5) is further explained below.

(i) The objective function $f$ maximizes the number of observable buses under the condition that key buses are all observable (i.e., binary variable V=1).

(ii) $u_i=1$ if bus i is observable under all possible topologies and 0 otherwise.

(iii) $J(G_k, C)$ is a comparison function. If all elements in $G_k$ under different topologies are larger than those in C, i.e., all key buses are observable under different topologies, the result is 1 and 0 otherwise.

(iv) Binary variable V=1 if all key buses are observable under different topologies, and 0 otherwise.

(v) l is the number of micro-PMUs to be placed.

Figure 4:
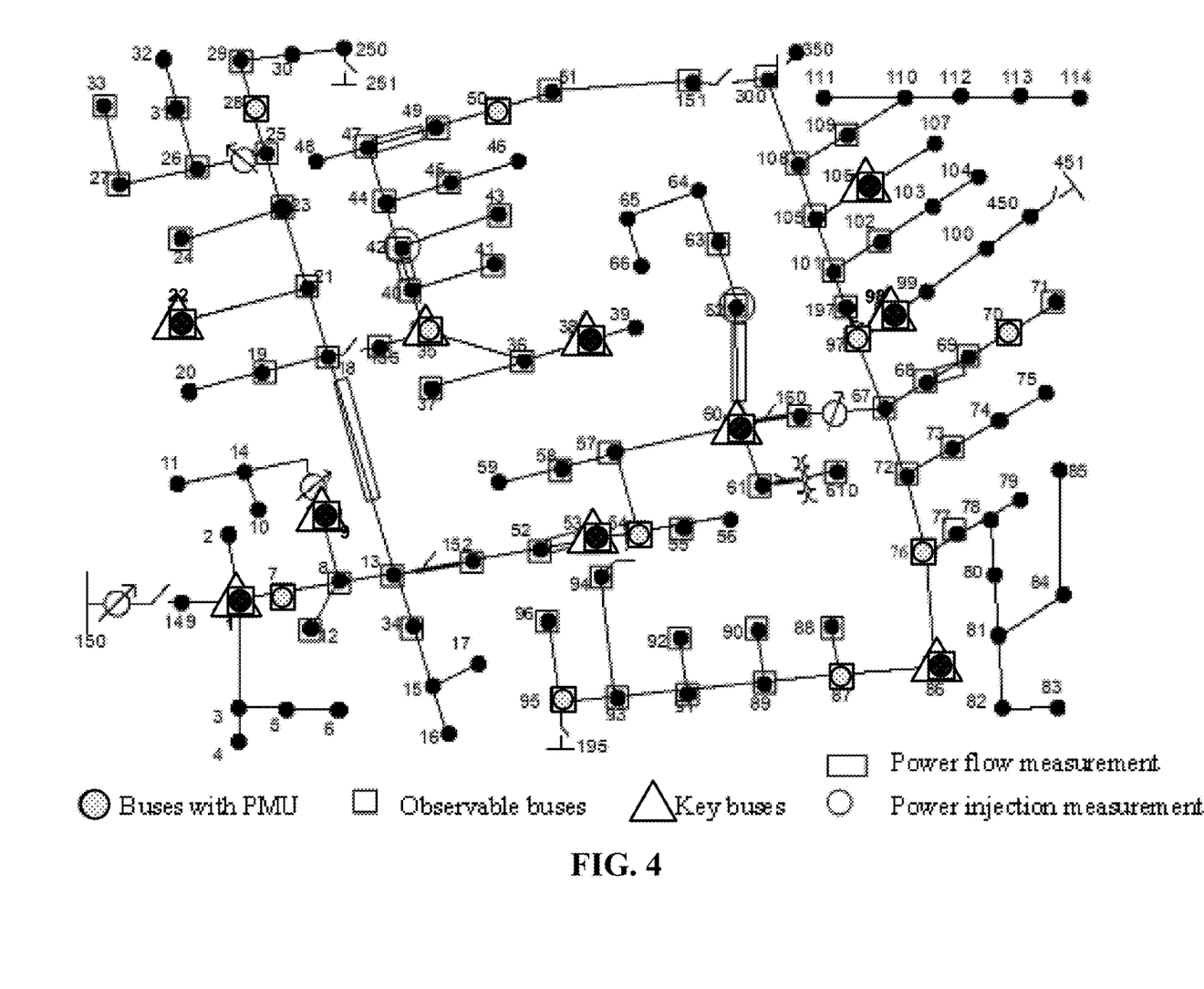
FIG. 4 illustrates an example of PMUs placement in a second situation according to one embodiment.

Take the IEEE 123-node test feeder as an example. Suppose that 10 buses (1, 9, 22, 35, 38, 53, 60, 86, 98, 106) are selected as key buses, and one of the possible topologies is shown in FIG. 4. Apply the above 3-stage group-based optimization method to solve the problem (5). The obtained optimization result shows that 10 micro-PMUs (placed at buses 7, 28, 35, 50, 54, 70, 76, 87, 95, 97) can observe all of the key buses, and a total of 79 buses can be observed. The locations of the micro-PMUs are shown in FIG. 4.

In the third situation, a specified number of micro-PMUs is given. The OPP aims to meet the following two requirements: (1) key buses are observable by the placement of micro-PMUs; if not, then (2) the number of observable key buses is as many as possible.

The following OPP problem formulation (i.e. problem (6)) is proposed and the solution for (6) satisfies the requirements for the third situation.

$$\max f = \sum_{i=1}^{N}\left(c_i \prod_{k=1}^{m} g_{ki}\right) * V \qquad (6)$$

$$\text{s.t. } G_k = g_k(X) = (g_{k1}, \dots, g_{kN})^T$$

$$V = \prod_{k=1}^{m} J(G_k, C_1)$$

$$C = C_1 + C_2 = (c_1, \dots, c_N)^T$$

$$C_1 = (c_{11}, \dots, c_{1N})^T$$

$$C_2 = (c_{21}, \dots, c_{2N})^T$$

$$X = [x_1, \dots, x_N]^T$$

$$x_i \in \{0, 1\}$$

$$\sum_{i=1}^{N} x_i = l$$

$$k = 1, \dots, m$$

$$i = 1, \dots, N$$

The problem (6) is further explained below.

(i) The objective function $f$ maximizes the number of observable key buses under the condition that key buses that must be observed are all observable (i.e., binary variable V=1);

(ii) $c_{1i}=1$ if bus i is a key bus and must be observed by micro-PMUs and 0 otherwise;

(iii) $c_{2i}=1$ if bus i is a key bus and needs to be observed by micro-PMUs if possible and 0 otherwise; and (iv) "+" is a logical operator "OR."

Figure 5:
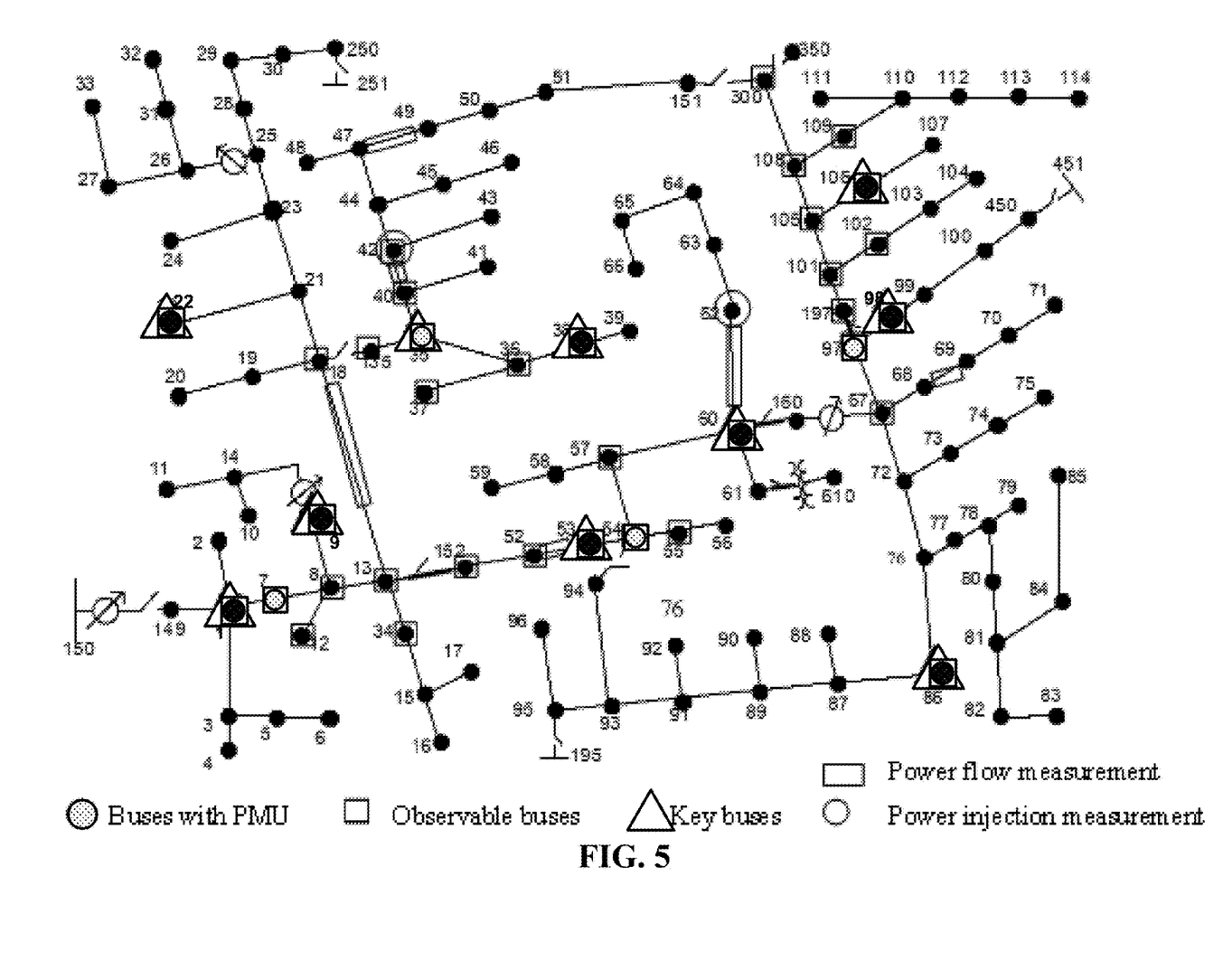
FIG. 5 illustrates an example of PMUs placement in a third situation according to one embodiment.

Take the IEEE 123-node test feeder as an example. Suppose that 10 buses (1, 9, 22, 35, 38, 53, 60, 86, 98, 106) are selected as key buses, of which buses 1 and 53 must be observed by micro-PMUs. One of the possible topologies is shown in FIG. 5, and the number of micro-PMUs to be placed is 4. Apply the proposed 3-stage group-based optimization method to solve (6) under the condition that 4 micro-PMUs are to be placed. The obtained optimization result shows that the 4 micro-PMUs are placed at buses 7, 35, 54, 97, which can provide real-time monitoring for 7 key buses (including buses 1 and 53). The locations of the micro-PMUs are shown in FIG. 5.

Partial state estimation with a limited number of micro-PMU measurements. After placing micro-PMUs at the locations that satisfy the requirement(s) described above in connection with the first situation, the second situation, or the third situation, the next task is to perform state estimation using measurements obtained by these micro-PMUs.

Weighted Least Squares (WLS) state estimation. According to the WLS state estimation method, the state variables are expressed in polar coordinates. The nonlinear measurement model is:

$$z = h(x) + e \qquad (7)$$

where z is the m×1 measurement vector, x is the n×1 vector of the state variables to be estimated, h(x) is the m×1 function vector relating measurements and state variables, and e is the m×1 measurement error vector.

A WLS formulation for the state estimation problem is:

$$\min J(x) = [z - h(x)]^T W^{-1}[z - h(x)] \qquad (8)$$

where $W = \text{diag}(\sigma_1^2, \dots, \sigma_i^2, \dots, \sigma_m^2)$ represents the covariance matrix of e, and $\sigma_i^2$ is the standard deviation of measurement i.

High-precision measurement residual constraints are added explicitly to the estimation model as follows:

$$\min J(x) = [z - h(x)]^T W^{-1} [z - h(x)]$$

$$\text{s.t. } h_{zero}(x) = 0$$

$$|z - h(x)| - \beta \leq 0 \qquad (9)$$

where $h_{zero}(x)$ represents the power balance functions for zero injection power measurements and $\beta$ is a scalar representing the measurement residual constraint.

To transform the constrained formulation into an unconstrained one, we add slack variables to the inequalities in (3) and use penalty factor $\alpha$ for the measurement residual constraints:

$$\min J(x, S) = [z - h(x)]^T W^{-1} [z - h(x)] + [h_{zero}(x)]^T W^{-1} [h_{zero}(x)] + \qquad (10)$$
$$\alpha \left( [|z - h(x)| - \beta + S^2]^T W^{-1} [|z - h(x)| - \beta + S^2] \right)$$

where S represents the slack variables. However, the measurement residuals according to (10) are generally unsatisfactory.

Quotient Gradient System (QGS) for state estimation. Embodiments of the invention develop and apply the trajectories of a nonlinear dynamical system, called Quotient Gradient System (QGS), to the state estimation.

By adding slack variables to the inequalities in (9), the following generalized equality constraint functions arise:

$$H(y) = \begin{bmatrix} H_E(x) \\ H_I(x, S) \end{bmatrix} = \begin{bmatrix} z - h(x) \\ h_{zero}(x) \\ |z - h(x)| - \beta + S^2 \end{bmatrix} = 0 \qquad (11)$$

$$y = (x, S)$$

According to embodiments of the invention, a nonlinear dynamical system is derived based on the equality constraints (11) to relate the solutions of (11) to the (stable) steady states of the QGS:

$$\dot{y} = Q_H(y) = -DH(y)^T H(y)$$

$$y = (x, S) \qquad (12)$$

where DH(y) is the Jacobian matrix of H(y). It can be shown that when the weighed factor $\sqrt{2/\sigma_i^2}$ is considered, the degenerate stable equilibrium manifolds (DSEM) of the QGS are the minimum solution to the following energy function:

$$E(y) = H(y)^T W^{-1} H(y). \qquad (13)$$

Therefore, a state estimation solution can be obtained by tracking the trajectory of the QGS.

$$\dot{y} = Q_H(y) = -DH_E(x)^T W_E^{-1} H_E(x) - \alpha(DH_I(x, S)^T W_I^{-1} H_I(x, S)) \qquad (14)$$

$$y = (x, S)$$

Partial state estimation. In practical applications, users may desire to accurately estimate partial state variables, such as voltage amplitudes and voltage phase angles, at key buses. The disclosed partial state estimation increases the accuracy of the estimated voltage amplitude and phase angle of key buses based on the QGS methods.

Considering a measurement system that provides micro-PMU measurements and virtual measurements (i.e., data derived from physical laws; e.g., zero-injection power measurements), the partial state estimation problem can be formulated as follows:

$$H(y) = \qquad (15)$$

$$\begin{bmatrix} H_E^{micro\text{-}PMU}(x, S) \\ H_E^{zero}(x) \\ H_I^{micro\text{-}PMU}(x, S) \end{bmatrix} = \begin{bmatrix} z^{micro\text{-}PMU} - h^{micro\text{-}PMU}(x) \\ h_{zero}(x) \\ |z^{micro\text{-}PMU} - h^{micro\text{-}PMU}(x)| - \beta + S^2 \end{bmatrix} = 0$$

$$y = (x, S)$$

In formulation (15), $H_E^{micro\text{-}PMU}(x)$ represents the function vector relating micro-PMU measurements to state variables, $H_E^{zero}(x)$ represents the power balance functions for zero-injection power measurements, and $H_I^{micro\text{-}PMU}(x)$ represents the measurement residual constraint function vector associated with micro-PMU measurements. In one embodiment, the measurement residual constraints include voltage amplitude measurement residual constraints and voltage phase angle measurement residual constraints.

A solution for (15) can be obtained by tracking the trajectory of the QGS to its steady state. More specifically, problem (15) can be solved by the QGS below:

$$\dot{y} = Q_H(y) = \qquad (16)$$
$$-DH_E^{micro\text{-}PMU}(x)^T W_E^{-1} H_E^{micro\text{-}PMU}(x) - DH_E^{zero}(x)^T W_E^{-1} H_E^{zero}(x) -$$
$$\alpha \left( DH_I^{micro\text{-}PMU}(x, S)^T W_I^{-1} H_I^{micro\text{-}PMU}(x, S) \right)$$

$$y = (x, S)$$

The proposed method for performing state estimation with a limited number of micro-PMU measurements is presented in the following steps. In one embodiment, the state estimation is a partial state estimation that estimates state variables such as voltage amplitudes and voltage phase angles. The method steps described below are applicable to both PMUs and micro-PMUs.

Step 1: Estimate the initial operating condition. The initial operating condition can be calculated using the last Supervisory Control and Data Acquisition (SCADA) measurements (if available), pseudo measurements (i.e., prediction and/or estimation), and virtual measurements. This calculation can use any effective known state estimation method, such as a WLS-Gauss Newton method.

Step 2: Construct a QGS. Formulate a QGS (e.g., (16)) according to a constraint set H(x) associated with measurements including micro-PMU measurements and virtual measurements. The constraint set H(x) is also referred to as a constraint set vector H(x). Among other elements, the constraint set H(x) includes voltage amplitude measurement residual constraints and voltage phase angle measurement residual constraints.

Step 3: Numerical Integration of the QGS. Integrate the QGS to its steady state and obtain a state estimation solution.

Step 4: Identify the residual violation. Examine the constraints set vector H(x) to check if the measurement residual of any state variable violates its corresponding measurement residual constraint (i.e., whether the inequality $|z_i - h(x_i)| \le \beta$ is violated; more specifically, whether the absolute value of the difference between the micro-PMU measurement $z_i$ and the corresponding calculated state variable value $x_i$ is greater than the constraint $\beta$). If there is no violation, go to Step 6; otherwise, go to Step 5.

Step 5: Reconstruct a QGS. Set the state variable $x_i$ identified at Step 4 to its micro-PMU measurement value $z_i$, thus removing the state variable from the list of state variables to be estimated. Then reconstruct a QGS to estimate the state variables remaining in the list, and go to Step 3.

Step 6: Output. Output the estimated state vector (which is composed of the values of the list of estimated state variables). The estimated state vector includes the estimated states of key buses.

The disclosed method, as well as the apparatus and the computer product implementing the method, can be applied to partial state estimation based on measurements gathered by a limited number of micro-PMUs in a distribution network. In alternative embodiments, the present disclosure can be applied to measurements gathered by other devices and technologies not limited to micro-PMUs.

Figure 6:
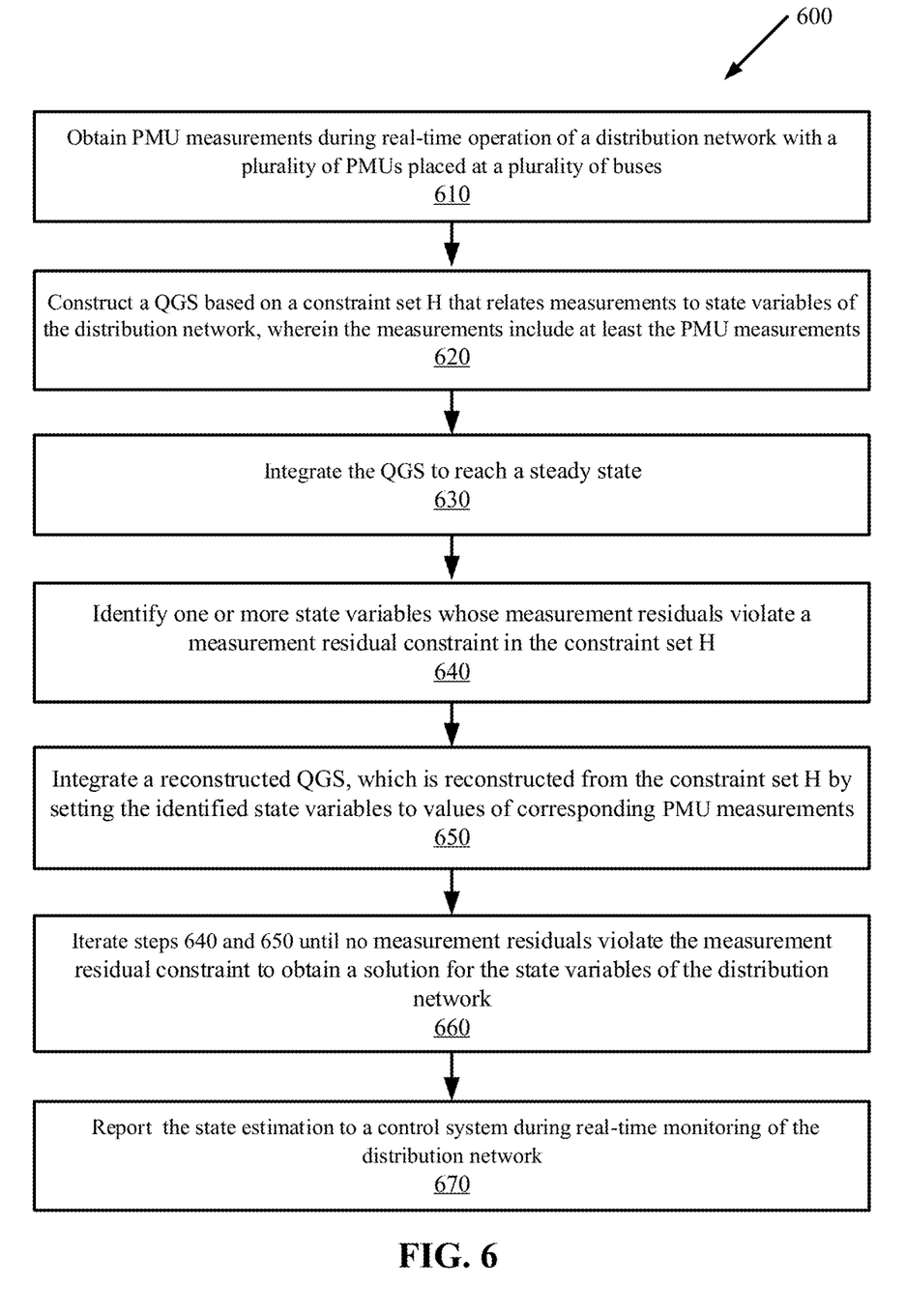
FIG. 6 is a flow diagram illustrating a method for a system to perform state estimation of a distribution network according to one embodiment.

FIG. 6 is a flow diagram illustrating a method 600 for state estimation of a distribution network according to one embodiment. The method 600 may be performed by a system, such as the computer system 175 in FIG. 1 and/or a computer system 700 in FIG. 7. The method 600 starts at step 610 when the system obtains PMU measurements during real-time operation of a distribution network with a plurality of PMUs placed at a plurality of buses. The system at step 620 constructs a QGS based on a constraint set H that relates measurements to state variables of the distribution network, wherein the measurements include at least the PMU measurements. The system at step 630 integrates the QGS to reach a steady state. The system at step 640 identifies one or more state variables whose measurement residuals violate a measurement residual constraint in the constraint set H. The system at step 650 integrates a reconstructed QGS, which is reconstructed from the constraint set H by setting the identified one or more state variables to values of corresponding PMU measurements (e.g., set the state variable $x_i$ to its PMU measurement value $z_i$). The system at step 660 iterates steps 640 and 650, until no measurement residuals violate the measurement residual constraint, to obtain a solution for the state variables of the distribution network. The system at step 670 reports the state estimation to a control system during real-time monitoring of the distribution network.

Figure 7:
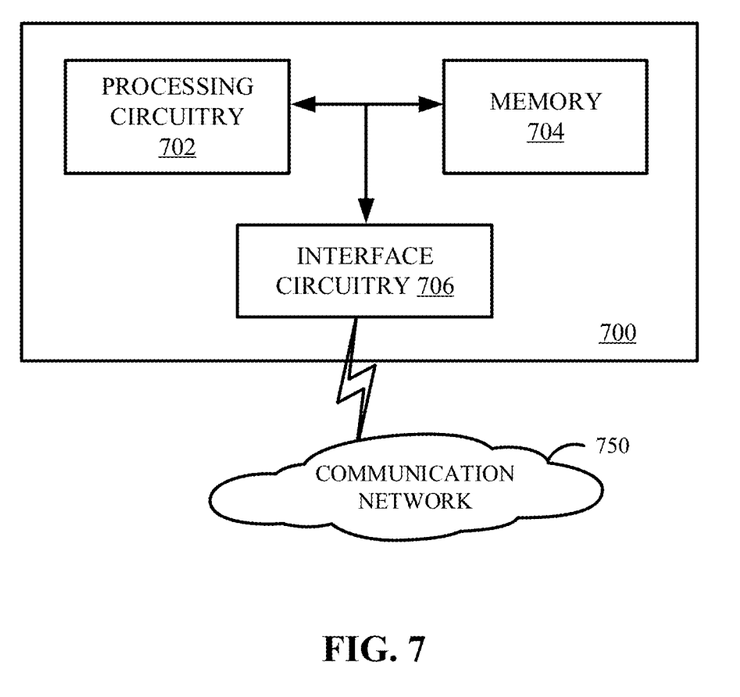
FIG. 7 is a block diagram of a computer system according to one embodiment.

FIG. 7 is a diagram of a computer system 700 according to one embodiment. The computer system 700 may be a server computer, a multi-processor computer, or any machine capable of executing a set of instructions (sequential or otherwise) that specify actions to be taken by that machine. While only a single machine is illustrated, the term "machine" shall also be taken to include any collection of machines (e.g., computers, processors and cores) that individually or jointly execute a set (or multiple sets) of instructions to perform any one or more of the methodologies discussed herein. In one embodiment, the computer system 700 includes circuitry which further includes processing circuitry 702, a memory 704, and interface circuitry 706. The interface circuitry 700 can include at least one input port and at least one output port. The memory 704 contains instructions executable by the processing circuitry 702 whereby the computer system 700 is operable to perform the various embodiments as described herein, including the method 600 of FIG. 6. In one embodiment, a part or all of the data and code for performing the various embodiments described herein may be received over a communication network 750 via the network interface device 706.

Embodiments may be implemented as a software product stored in a machine-readable medium (such as the non-transitory machine-readable storage media, also referred to as a computer-readable medium, a processor-readable medium, or a computer-usable medium having a computer-readable program code embodied therein). The non-transitory machine-readable medium may be any suitable tangible medium including a magnetic, optical, or electrical storage medium including a diskette, compact disk read-only memory (CD-ROM), digital versatile disc read-only memory (DVD-ROM) memory device (volatile or non-volatile) such as hard drive or solid-state drive, or similar storage mechanism. The machine-readable medium may contain various sets of instructions, code sequences, configuration information, or other data, which, when executed, cause a processor to perform steps in a method according to an embodiment. Those of ordinary skill in the art will appreciate that other instructions and operations necessary to implement the described embodiments may also be stored on the machine-readable medium. Software running from the machine-readable medium may interface with circuitry to perform the described tasks.

Various functional components or blocks have been described herein. As will be appreciated by persons skilled in the art, the functional blocks will preferably be implemented through circuits (either dedicated circuits or general-purpose circuits, which operate under the control of one or more processors and coded instructions), which will typically comprise transistors that are configured in such a way as to control the operation of the circuitry in accordance with the functions and operations described herein.

The operations of the flow diagram of FIG. 6 have been described with reference to the exemplary embodiments of FIGS. 1 and 7. However, it should be understood that the operations of the flow diagram of FIG. 6 can be performed by embodiments of the invention other than the embodiments of FIGS. 1 and 7, and the embodiments of FIGS. 1 and 7 can perform operations different than those discussed with reference to the flow diagram. While the flow diagram of FIG. 6 shows a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method for state estimation of a distribution network, comprising:
   (a) obtaining measurements from a plurality of phasor measurement units (PMUs) placed at a plurality of buses in the distribution network;
   (b) constructing a quotient gradient system (QGS) based on a constraint set H that relates the measurements to state variables of the distribution network;
   (c) integrating the QGS to reach a steady state;
   (d) identifying one or more of the state variables whose measurement residuals violate a measurement residual constraint in the constraint set H;

(e) integrating a reconstructed QGS, which is reconstructed based on the constraint set H by setting the identified one or more state variables to values of corresponding PMU measurements;

(f) iterating steps of (d) and (e) until no measurement residuals violate the measurement residual constraint, to thereby obtain a solution for the state variables as the state estimation; and (g) reporting the state estimation to a control system during real-time monitoring of the distribution network.

2. The method of claim 1, wherein the plurality of PMUs include a plurality of micro-PMUs.

3. The method of claim 1, further comprising:
determining optimal placement of the PMUs at the buses by solving a nonlinear integer programming problem constrained by at least an observability requirement for a subset of the buses.

4. The method of claim 3, wherein solving the nonlinear integer programming problem further comprises: performing discrete particle swarm optimization, clustering of particles, and local optimization.

5. The method of claim 3, wherein determining the optimal placement further comprises:
identifying a minimal number and locations of the PMUs to be placed in the distribution network according to a requirement specifying that all predetermined key buses are observable from the measurements.

6. The method of claim 3, wherein determining the optimal placement further comprises:
identifying locations of a predetermined number of PMUs to be placed in the distribution network according to requirements specifying that all predetermined key buses are observable from the measurements and observable non-key buses are maximized in number.

7. The method of claim 3, wherein determining the optimal placement further comprises:
identifying locations of a predetermined number of PMUs to be placed in the distribution network according to a requirement specifying that observable key buses are maximized in number.

8. The method of claim 1, wherein the state estimation includes voltage amplitudes and phase angles at a subset of the buses.

9. The method of claim 8, wherein the subset of the buses includes key buses predetermined to be observable.

10. The method of claim 1, further comprising:
determining optimal placement of the PMUs at the buses to satisfy an observability requirement, wherein the observability requirement is formulated with an observability vector that identifies whether each of the buses in the distribution network is to be observable.

11. The method of claim 1, wherein the constraint set H comprises:
a function vector ($H_E^{micro-PMU}(x)$) relating the measurements to the state variables, a power-balance function vector ($H_E^{zero}(x)$) representing zero-injection power measurements, and a measurement residual constraint function vector ($H_I^{micro-PMU}(x)$) relating the measurements to the measurement residual constraint.

12. The method of claim 1, wherein the measurement residual constraints constrain a difference between calculated values of the state variables and corresponding PMU measurements.

13. A non-transitory computer-readable storage medium including instructions that, when executed by a computer system, cause the computer system to perform state estimation of a distribution network, the computer system operative to:

(a) obtain measurements from a plurality of phasor measurement units (PMUs) placed at a plurality of buses in the distribution network;

(b) construct a quotient gradient system (QGS) based on a constraint set H that relates the measurements to state variables of the distribution network;

(c) integrate the QGS to reach a steady state;

(d) identify one or more of the state variables whose measurement residuals violate a measurement residual constraint in the constraint set H;

(e) integrate a reconstructed QGS, which is reconstructed based on the constraint set H by setting the identified one or more state variables to values of corresponding PMU measurements;

(f) iterate steps of (d) and (e) until no measurement residuals violate the measurement residual constraint, to thereby obtain a solution for the state variables as the state estimation; and (g) report the state estimation to a control system during real-time monitoring of the distribution network.

14. The non-transitory computer-readable storage medium of claim 13, wherein the plurality of PMUs include a plurality of micro-PMUs.

15. The non-transitory computer-readable storage medium of claim 13, wherein the instructions when executed by the computer system, cause the computer system to:
determine optimal placement of the PMUs at the buses by solving a nonlinear integer programming problem constrained by at least an observability requirement for a subset of the buses.

16. The non-transitory computer-readable storage medium of claim 15, wherein the computer system in determining the optimal placement is further operative to:
identify a minimal number and locations of the PMUs to be placed in the distribution network according to a requirement specifying that all predetermined key buses are observable from the measurements.

17. The non-transitory computer-readable storage medium of claim 15, wherein the computer system in determining the optimal placement is further operative to:
identify locations of a predetermined number of PMUs to be placed in the distribution network according to requirements specifying that all predetermined key buses are observable from the measurements and observable non-key buses are maximized in number.

18. The non-transitory computer-readable storage medium of claim 15, wherein the computer system in determining the optimal placement is further operative to:
identify locations of a predetermined number of PMUs to be placed in the distribution network according to a requirement specifying that observable key buses are maximized in number.

19. The non-transitory computer-readable storage medium of claim 13, wherein the state estimation includes voltage amplitudes and phase angles at a subset of the buses.

20. The non-transitory computer-readable storage medium of claim 13, wherein the measurement residual constraints constrain a difference between calculated values of the state variables and corresponding PMU measurements.

* * * * *